(12) United States Patent
Wilson et al.

(10) Patent No.: US 6,313,773 B1
(45) Date of Patent: Nov. 6, 2001

(54) MULTIPLIERLESS INTERPOLATOR FOR A DELTA-SIGMA DIGITAL TO ANALOG CONVERTER

(75) Inventors: Gerald Wilson; Robert S. Green, both of Salt Lake City, UT (US)

(73) Assignee: Sonic Innovations, Inc., Salt Lake City, UT (US)

( * ) Notice: Subject to any disclaimer, the term of this patent is extended or adjusted under 35 U.S.C. 154(b) by 0 days.

(21) Appl. No.: 09/491,695

(22) Filed: Jan. 26, 2000

(51) Int. Cl.[7] .................................................. H03M 3/00
(52) U.S. Cl. ............................ 341/143; 370/545; 708/313
(58) Field of Search ................................ 341/143, 144, 341/155, 118, 122, 115, 110; 708/313, 318; 364/724.16, 724.01; 320/545; 375/350; 379/386

(56) References Cited

U.S. PATENT DOCUMENTS

| | | | |
|---|---|---|---|
| 3,234,544 | 2/1966 | Marenholtz | 340/347 |
| 3,298,019 | 1/1967 | Nossen | 340/347 |
| 3,509,557 | 4/1970 | Groth | 340/347 |
| 3,582,947 | 6/1971 | Harrison | 340/347 |
| 3,678,501 | 7/1972 | Prill | 340/347 AD |
| 3,692,959 | 9/1972 | Lamp | 179/175.1 A |
| 3,750,142 | 7/1973 | Barnes et al. | 340/347 |
| 4,114,149 | 9/1978 | Kendall | 340/347 |
| 4,210,903 | 7/1980 | LaBrie | 340/347 NT |
| 4,243,974 | 1/1981 | Mack | 340/347 NT |
| 4,291,300 | 9/1981 | Bader | 340/347 AD |

(List continued on next page.)

FOREIGN PATENT DOCUMENTS

| | | | |
|---|---|---|---|
| 44 41 996 | 5/1996 | (DE) | H04R/25/00 |
| 195 45 760 | 2/1997 | (DE) | H04R/25/00 |
| 0 341 903 | 5/1989 | (EP) | H04R/25/00 |
| 0 714 067 | 9/1995 | (EP) | G06F/13/38 |
| 0 823 829 | 11/1998 | (EP) | H04R/25/00 |
| 98/28943 | 7/1998 | (WO) | H04R/25/00 |
| 99/26453 | 5/1999 | (WO) | H04R/25/00 |

OTHER PUBLICATIONS

"Delta–Sigma Overview", Fall 1996, ECE 627, pp. 1–29.
Karema, et al., "An Oversampled Sigma–Delta AD Converter Circuit Using Two–Stage Fourth Order Modulator", 1990, IEEE, pp. 3279–3282.
Norsworthy et al., "Delta–Sigma Data Converters", IEEE Circuits & Systems Society, pp. 321–324.
Riley, et al., "High Decimation Digital Filters", 1991, IEEE, pp. 1613–1615.
P.P. Vardyanathan, "Multrate Systems and Filter Banks", 1993, Prentice Hall, pp. 118–133.
Lee, et al., "A Self–Calibrating 15 Bit CMOS A/D Converter", Dec. 1984, IEEE J. Solid–State Circuits, vol. SC–19, No. 6, pp. 813–819.

*Primary Examiner*—Brian Young
*Assistant Examiner*—John Nguyen
(74) *Attorney, Agent, or Firm*—Thelen Reid & Priest LLP; David B. Ritchie (57) ABSTRACT

A simplified algorithm for digital signal interpolation and a novel architecture to implement the algorithm in an integrated circuit ("IC") with significant space constraints are presented. According to embodiments of the present invention, the interpolator is divided into two parts. The first part of the interpolator increases the sample rate by a factor of two and smoothes the signal using a half-band Infinite Impulse Response ("IIR") filter. The second part of the interpolator increases the sample rate of the signal by a factor of thirty-two using a zero-order-hold ("ZOH") circuit. In one embodiment, the half-band IIR filter is implemented using an all-pass lattice structure to minimize quantization effects. The lattice coefficients are chosen such that the structure can achieve all filter design requirements, yet is capable of being implemented with a small number of shifters and adders, and no multipliers.

11 Claims, 10 Drawing Sheets

U.S. PATENT DOCUMENTS

| | | | |
|---|---|---|---|
| 4,396,806 | 8/1983 | Anderson | 179/107 FD |
| 4,590,459 | 5/1986 | Lanz et al. | 340/347 AD |
| 4,602,337 | 7/1986 | Cox | 364/480 |
| 4,696,032 | 9/1987 | Levy | 379/390 |
| 4,701,958 | 10/1987 | Neth | 381/68 |
| 4,739,305 | 4/1988 | Naito | 340/347 AD |
| 4,773,088 | 9/1988 | Matheny | 379/395 |
| 4,972,487 | 11/1990 | Mangold et al. | 381/68 |
| 5,059,981 | 10/1991 | Hauser | 341/164 |
| 5,103,230 | 4/1992 | Kalthoff et al. | 341/166 |
| 5,126,743 | 6/1992 | Hobbs | 341/157 |
| 5,241,310 | 8/1993 | Tiemann | 341/143 |
| 5,392,348 * | 2/1995 | Park et al. | 379/386 |
| 5,500,902 | 3/1996 | Stockham, Jr. et al. | 381/68.4 |
| 5,710,820 | 1/1998 | Martin et al. | 381/68.4 |
| 5,748,126 * | 5/1998 | Ma et al. | 341/143 |
| 5,907,299 | 5/1999 | Green et al. | 341/143 |
| 5,995,036 | 11/1999 | Nise et al. | 341/172 |
| 6,044,162 | 3/2000 | Mead et al. | 381/312 |
| 6,072,885 | 6/2000 | Stockham, Jr. et al. | 381/321 |
| 6,208,671 * | 3/2001 | Paulos et al. | 370/545 |

* cited by examiner

MULTIPLIERLESS INTERPOLATOR FOR A DELTA-SIGMA DIGITAL TO ANALOG CONVERTER

BACKGROUND OF THE INVENTION

1. Field of the Invention

The present invention relates to electronic hearing devices and electronic systems for sound reproduction. More particularly, the present invention relates to the field to delta-sigma digital-to-analog data converters ("DACs"), and specifically to converting the digitally processed sound in a hearing aid to an analog waveform. The present invention can be used in any digital signal processing device, including, without limitation, hearing aids, telephones, assistive listening devices, and public address systems.

2. The Background Art

An essential part of a delta-sigma digital to analog converter ("DAC") is an interpolator which increases the sample rate of the digital signal being converted. From a theoretical standpoint, interpolator algorithms and interpolator structures are well documented in the digital signal processing literature. As is know to those skilled in the art, most interpolators utilize a polyphase structure with either a finite impulse response ("FIR") or infinite impulse response ("IIR") filter. FIR and IIR filter design is not discussed in detail herein, so as not to overcomplicate the present disclosure. However, the topic is extensively treated in books such as *"Multirate Systems and Filter Banks,"* by P. P. Vaidyanathan (Prentice Hall, 1993).

Because they require adder and multiplier circuitry, most theoretical interpolator structures, taken directly, are computationally too complex to implement in the amount of circuitry available in certain small-size, low-power applications such as hearing aids. In such applications, the amount of silicon area to implement the interpolator circuit must be kept to a minimum, and hence the interpolator must be implemented without a multiplier.

Unfortunately, digital interpolator algorithms and structures capable of achieving design requirements in a computationally efficient and circuit area efficient manner so as to be suitable for use in small-size, low-power applications are not currently available.

Thus, the present invention provides an interpolator algorithm and structure suitable for use in small-size, low-power applications. The interpolator algorithm and structure according to aspects of the present invention achieves the design requirements in a computationally efficient and circuit area efficient manner. As part of a larger and more complex signal processing system, it facilitates providing better sound quality to end customers. Embodiments of the present invention can be used in any application where using a multiplierless interpolator is desired. These and other features and advantages of the present invention will be presented in more detail in the following specification of the invention and in the associated figures.

SUMMARY OF THE INVENTION

A simplified algorithm for digital signal interpolation and a novel architecture to implement the algorithm in an integrated circuit ("IC") with significant space constraints are presented. According to embodiments of the present invention, the interpolator is divided into two parts. The first part of the interpolator increases the sample rate by a factor of two and smoothes the signal using a half-band Infinite Impulse Response ("IIR") filter. The second part of the interpolator increases the sample rate of the signal by a factor of thirty-two using a zero-order-hold ("ZOH") circuit. In one embodiment, the half-band IIR filter is implemented using an all-pass lattice structure to minimize quantization effects. The lattice coefficients are chosen such that the structure can achieve all filter design requirements, yet is capable of being implemented with a small number of shifters and adders, and no multipliers.

BRIEF DESCRIPTION OF THE DRAWINGS

The accompanying drawings, which are incorporated in and constitute a part of this specification, illustrate an embodiment of the invention and, together with the present description, serve to explain the principles of the invention.

In the drawings.

DETAILED DESCRIPTION

Those of ordinary skill in the art will realize that the following description of the present invention is illustrative only and not in any way limiting. Other embodiments of the invention will readily suggest themselves to such skilled persons, having the benefit of the present disclosure. Reference will now be made in detail to an implementation of the present invention as illustrated in the accompanying drawings. The same reference numbers will be used throughout the drawings and the following description to refer to the same or like parts.

As is known to those skilled in the art, an interpolator is a critical component of a delta sigma digital-to-analog converter ("DAC"). Its purpose is to suppress high frequency images of the base band signal that occur as a result of the up-sampling process.

In one embodiment of the present invention, a seventh order interpolator structure for a delta sigma digital to analog converter with a 20 kHz sampling rate is implemented. The first stage of the interpolator increases the sample rate by two and rejects the first image between 10 and 30 kHz. A 32:1 zero-order-hold ("ZOH") (i.e., sample and hold) circuit follows this filter. The output of the interpolator is then sampled at 64 times the input sample rate.

In this embodiment, the first stage interpolator is an elliptical half-band low pass filter comprising two all-pass filters. The transfer function of the filter is given by the following equation:

$$H(z)=A_0(z^2)+z^{-1}A_1(z^2)$$

Figure 1:
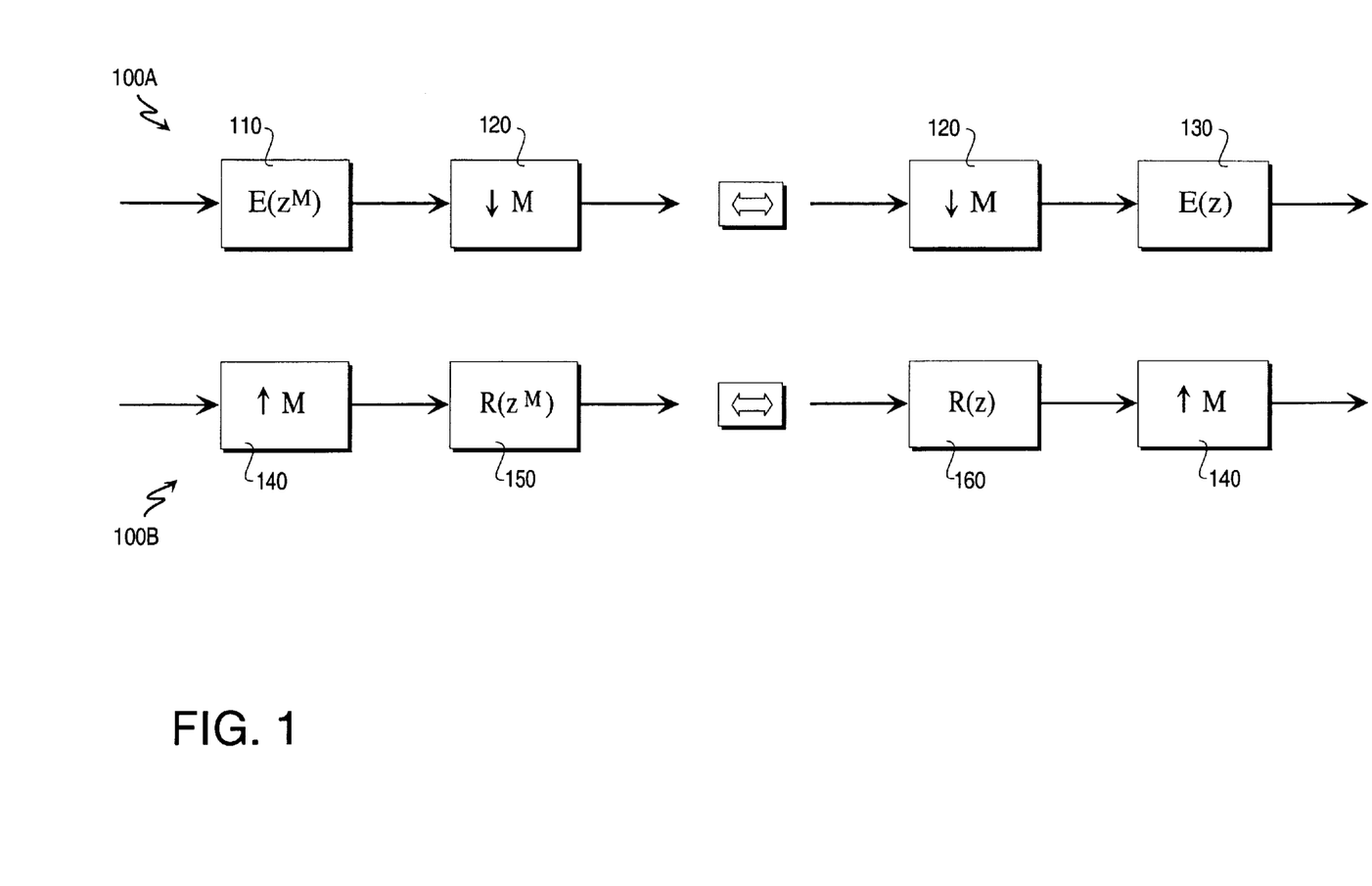
FIG. 1 is a block diagram illustrating application of the Noble identities according to aspects of the present invention.

As is known to those skilled in the art, in an interpolator, a 2:1 expander normally precedes the low pass filter, and the expander increases the sample rate by a factor of two. However, as shown in FIG. 1, according to Noble identity 100B, a design where an expander 140 precedes a filter 150 may be replaced by a design where the expander 140 follows filter 160, assuming that the filter $R(z^M)$ 150 is rational (i.e., a ratio of polynomials in z or $z^{-1}$). Similarly, under the same rationality assumption, Noble identity 100A states that a design where a decimator 120 follows a filter 110 may be replaced by a design where the decimator 120 precedes a filter 130.

Thus, applying the Noble identities as shown in FIG. 1, the filters $A_0(z^2)$ and $A_1(z^2)$ of the above interpolator equation can be interchanged with the expander. After performing the appropriate identity, the expander follows the filter rather than precedes it. The result is that the two filters, $A_0(z)$ and $A_1(z)$, operate at the slower rate (e.g., 20 kHz) rather than at the faster rate (e.g., 40 kHz). The outputs of the two filters are interleaved to form a fast rate (e.g., 40 kHz) signal. This interpolator structure is illustrated in FIG. 2.

Figure 2:
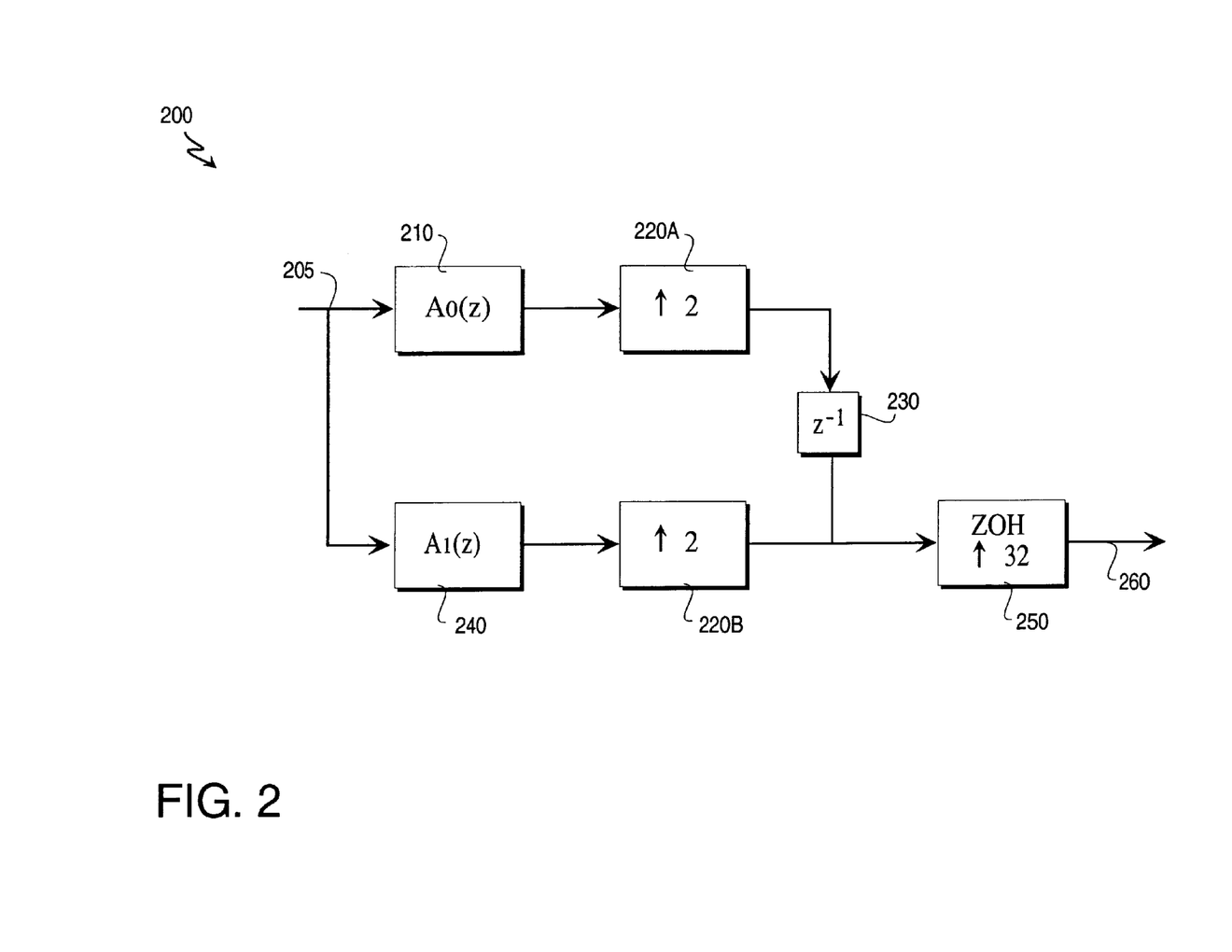
FIG. 2 is a block diagram illustrating an interpolator structure according to aspects of the present invention.

Referring now to FIG. 2, there is shown a top-level block diagram of an interpolator 200 according to the present invention. The input 205 to interpolator 200 is first processed by transfer function $A_0(z)$ 210, and then expanded by a factor of two at block 220A. In parallel, the input 205 to interpolator 200 is also processed by transfer function $A_1(z)$ 240, which is then expanded by a factor of two by block 220B. The output of expander 220A passes through a delay element 230, and is then interleaved with the output of expander 220B. This interleaved output forms the input to zero-order-hold ("ZOH") circuit 250, which essentially repeats the same value for 32 clock cycles according to one embodiment of the present invention.

Thus, the zero-order-hold circuit 250 increases the sample rate by an additional factor of 32 by holding the value of the first stage interpolator for 32 consecutive samples. In one embodiment, output samples are clocked out of interpolator 200 at a 1.28 MHz rate (i.e., 64 times the input sample rate of 20 kHz). In the frequency domain, the 0 to 40 kHz band is replicated 31 times and is shaped by a sinc function. The sinc function will have a 3 dB point at 10 kHz and nulls at multiples of 20 kHz. Many of the images will have significant amplitude, but they will be swamped by the quantization noise of the delta-sigma modulator.

Figure 3A:
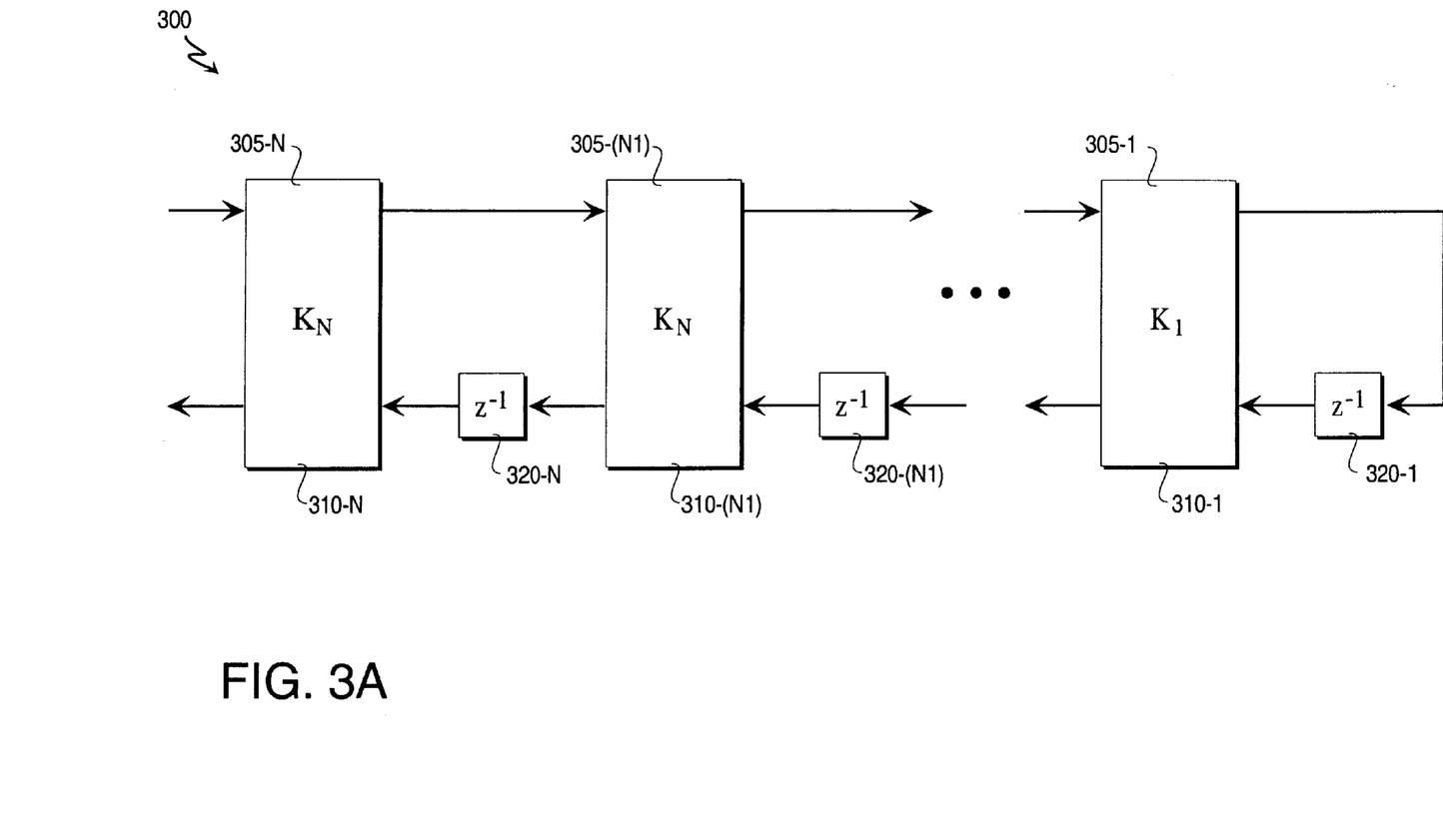
FIG. 3A is a block diagram illustrating a lattice structure that may be used to implement an interpolator according to aspects of the present invention.

The all-pass filters, $A_0(z)$ and $A_1(z)$, can be efficiently implemented using a lattice structure. The details of this implementation process are not discussed herein, so as not to overcomplicate the present discussion. However, relevant information may be found, for example, in pages 79–83 of "*Multirate Systems and Filter Banks,*" by P. P. Vaidyanathan (Prentice Hall, 1993). The all-pass lattice decomposes a higher order all pass filter into a cascade of $1^{st}$ order all pass stages. FIG. 3 illustrates the all pass lattice structure.

Referring now to FIG. 3A, there is shown a block diagram of an all-pass lattice filter structure 300 that may be used to implement an interpolator according to aspects of the present invention. As shown in FIG. 3A, filter 300 comprises N stages 305-1–305-N. Each stage 305-$i$ comprises a filter element 310-$i$ and a feedback delay element 320-$i$. The various stages 305-1–305-N are connected in a cascaded configuration to form all-pass lattice filter 300.

Figure 3B:
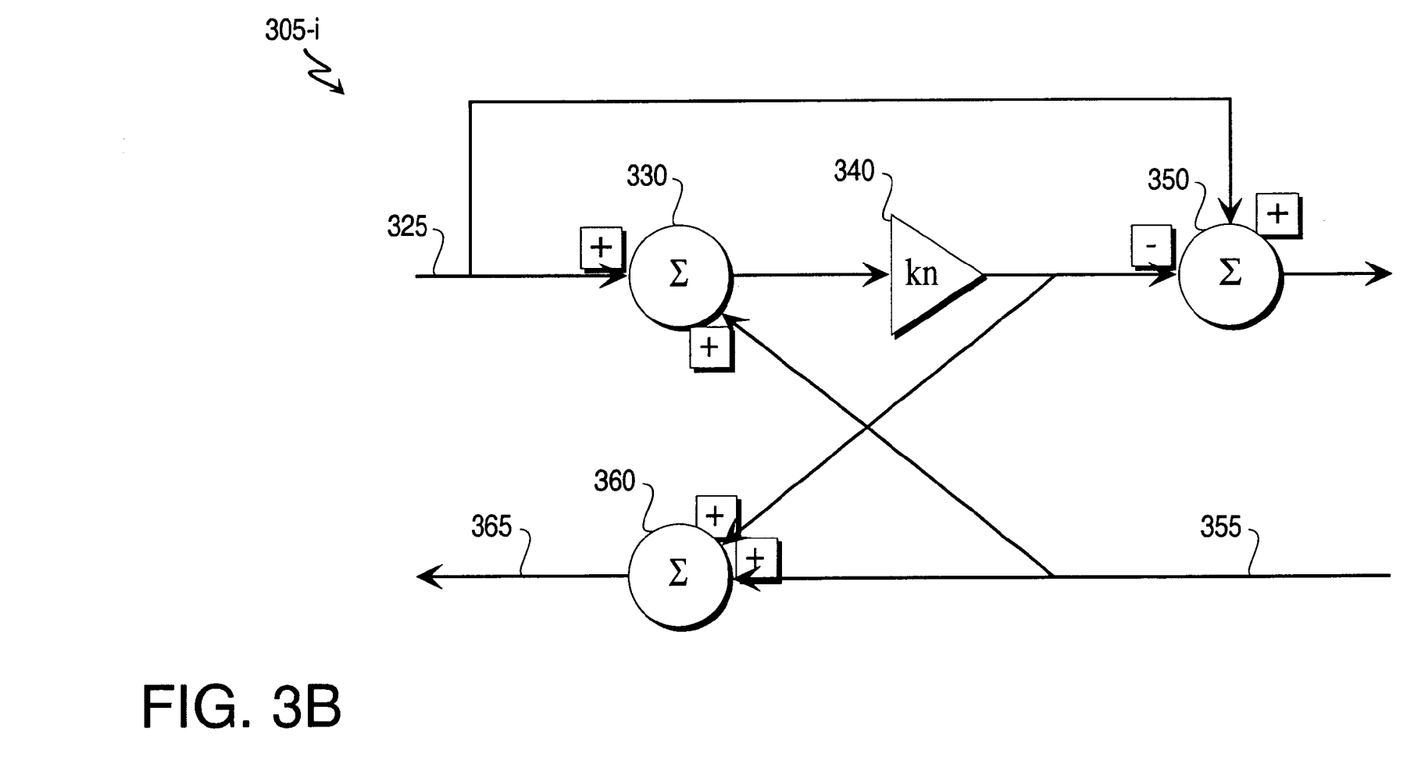
FIG. 3B is a block diagram illustrating a component of a lattice structure that may be used to implement an interpolator according to aspects of the present invention.

Referring now to FIG. 3B, there is shown a more detailed block diagram of one exemplary filter element stage 300-$i$. As shown in FIG. 3B, each filter element stage 305-$i$ comprises three adders 330, 350, 360, and an amplifier 340. The input 325 to each filter element stage forms one input to adder 330 and to adder 350. The second input to adder 330 comes from a subsequent filter stage. The output of adder 330 is amplified at block 340, and the output of amplifier block 340 is then inverted and used as the second input to adder 350. The output of amplifier block 340 is also routed in parallel to adder 360, where it is added to the output 355 of another filter stage. The output 365 of adder 360 forms an input to a subsequent filter stage.

As previously discussed, in many applications, especially where circuit area is a significant constraint, it may be desirable to implement the interpolator without using any multipliers. According to aspects of the present invention, interpolator functions suitable for multiplierless implementations may be identified by the following process. First, a filter optimization routine using specialized or commercially-available digital processing design tools (e.g., MATLAB™) is used to identify the best filter possible for a given level of quantization. Specifically, the optimization routine calculates elliptical low pass filters of a specified order. Next, the optimization routine sweeps across a range of cutoff frequencies, looking for filters whose lattice coefficients have no more than a specified number of bits set to "1" for a given number of quantization levels. For example, in one embodiment, the optimization routine searched for filters whose lattice coefficients had not more than 4 bits set when quantized to 128 levels. Finally, of the filters meeting the quantization criteria, the optimization routine selects the one with the minimum stop band energy. This filter will be the one best matching the non-quantized filter.

Using this optimization procedure, in one embodiment of the present invention, a seventh order low-pass filter with a stop band attenuation of approximately 50 dB and a cutoff frequency of 0.5931 normalizing to a sample rate of 2 was designed. The frequency response of this filter is plotted in FIG. 4, and the lattice coefficients (referring to FIGS. 3A and 3B) are given by the values below:

$$k_{0,0}=108/128=0.84375_{10}=0.1101100_2$$

$$k_{0,1}=14/128=0.109375_{10}=0.0001110_2$$

$$k_{1,0}=57/128=0.4453125_{10}=0.0111001_2$$

It should be noted that that the frequency response of this filter has a gain of 6 dB. This gain offsets the attenuation of 6 dB incurred by the expander. The first stage interpolator has unity gain.

Figure 4:
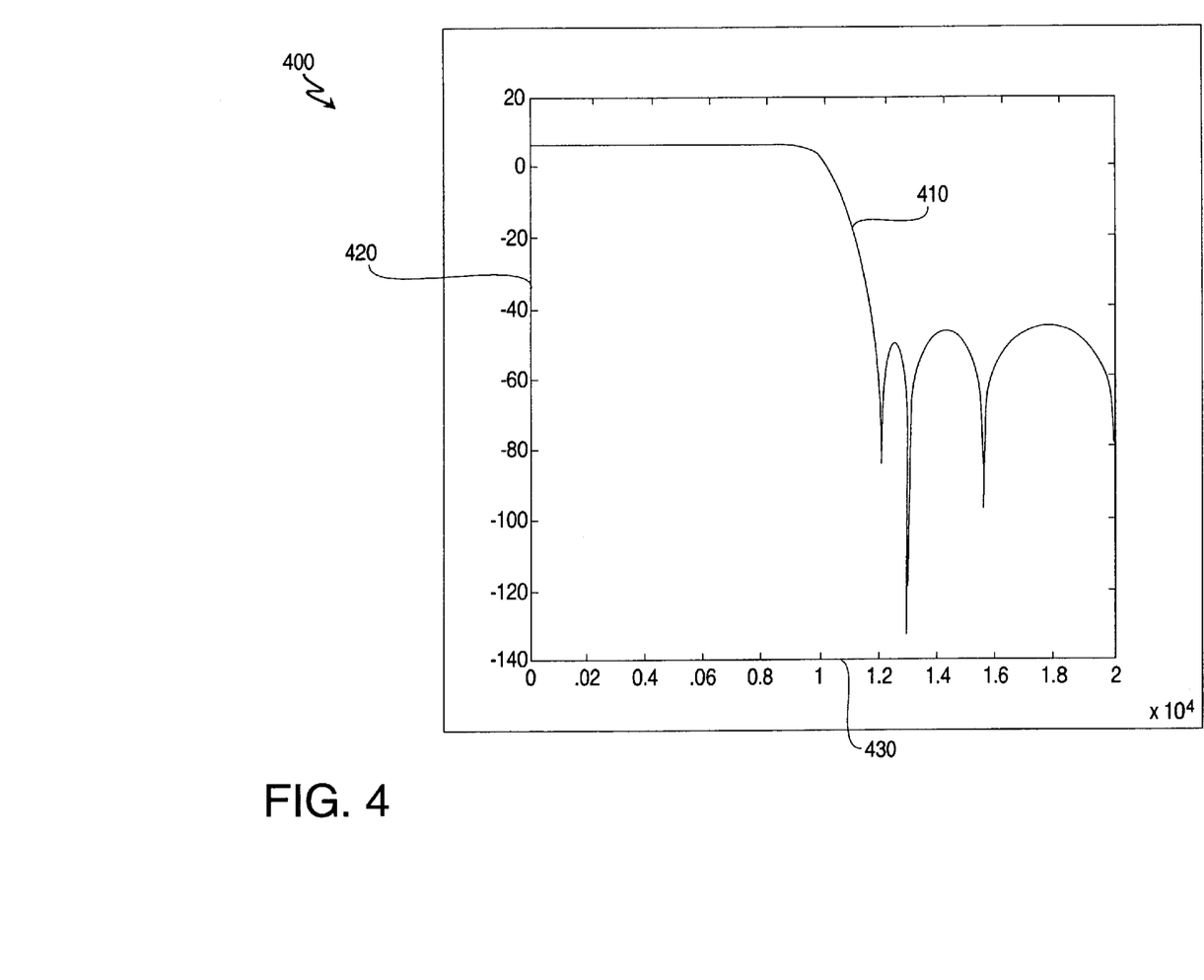
FIG. 4 is a frequency response graph of one stage of an interpolator according to one embodiment of the present invention.

Referring now to FIG. 4, frequency response curve 410 is shown in decibel ("dB") units along axis 420 as a function of frequency 430, which ranges from 0 Hz to 20 kHz in FIG. 4. The cut-off frequency of frequency response curve 410 is at approximately 10 kHz, and the side lobes are rejected by approximately 45 dB.

Figure 5:
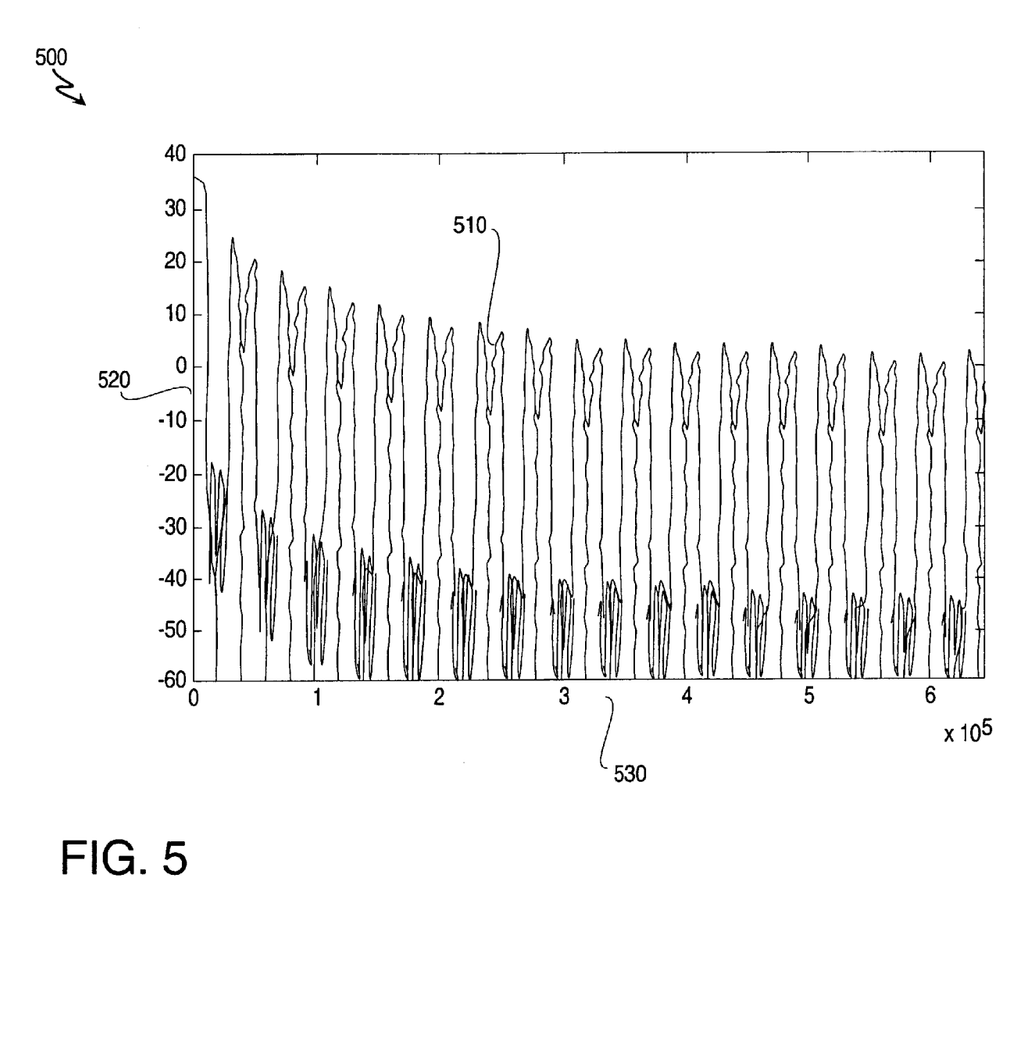
FIG. 5 is a frequency response graph of the entire interpolator according to one embodiment of the present invention.

The frequency response of the entire interpolator is plotted in FIG. 5. Again the increased gain, now 36 dB, offsets the attenuation of the expander (since a 64X expander has an attenuation of $20*\log_{10}(64)=36$ dB). The overall interpolator has unity gain at zero frequency. Referring now to FIG. 5, there is shown a frequency response graph 500 of the entire interpolator according to one embodiment of the present invention. As shown in FIG. 5, frequency response curve 510 is shown in decibel ("dB") units along axis 520 as a function of frequency 530, which ranges from 0 Hz to approximately 650 kHz in FIG. 5. As shown in FIG. 5, the cut-off frequency of frequency response curve 510 is still at approximately 10 kHz. It should also be noted that there is significant sidelobe energy in the frequency graph shown in FIG. 5. However, this undesired sidelobe energy has been modulated up to frequency ranges far above the range of normal human hearing, and such energy will be naturally be filtered out by additional elements (such as output transducers) in the systems in which embodiments of the present invention would typically be used.

As previously discussed, the first stage interpolation filter is designed to have coefficients whose binary representation has a small number of bits set to "1." With these coefficients, the coefficient multiplier normally required can be implemented with shifters and adders, and no multiplier is thus required. In one embodiment, as demonstrated in the above equations, two of the coefficients have four "1's" and one has three "1's." Therefore, according to aspects of the present invention, the multipliers can be implemented with 11 shifters and 8 adders. It should be noted that the shifters must be arithmetic shifters (i.e., sign extended). The lattice structure requires three more adders and one register per section. The total number of computations is 11 shifts and 17 additions per digital input sample. The design also requires three registers. Since in this embodiment the input to the DAC is 18-bits wide, the three registers are also 18 bits wide. The overall block diagram, from a functional perspective, is presented in FIG. 6.

Figure 6:
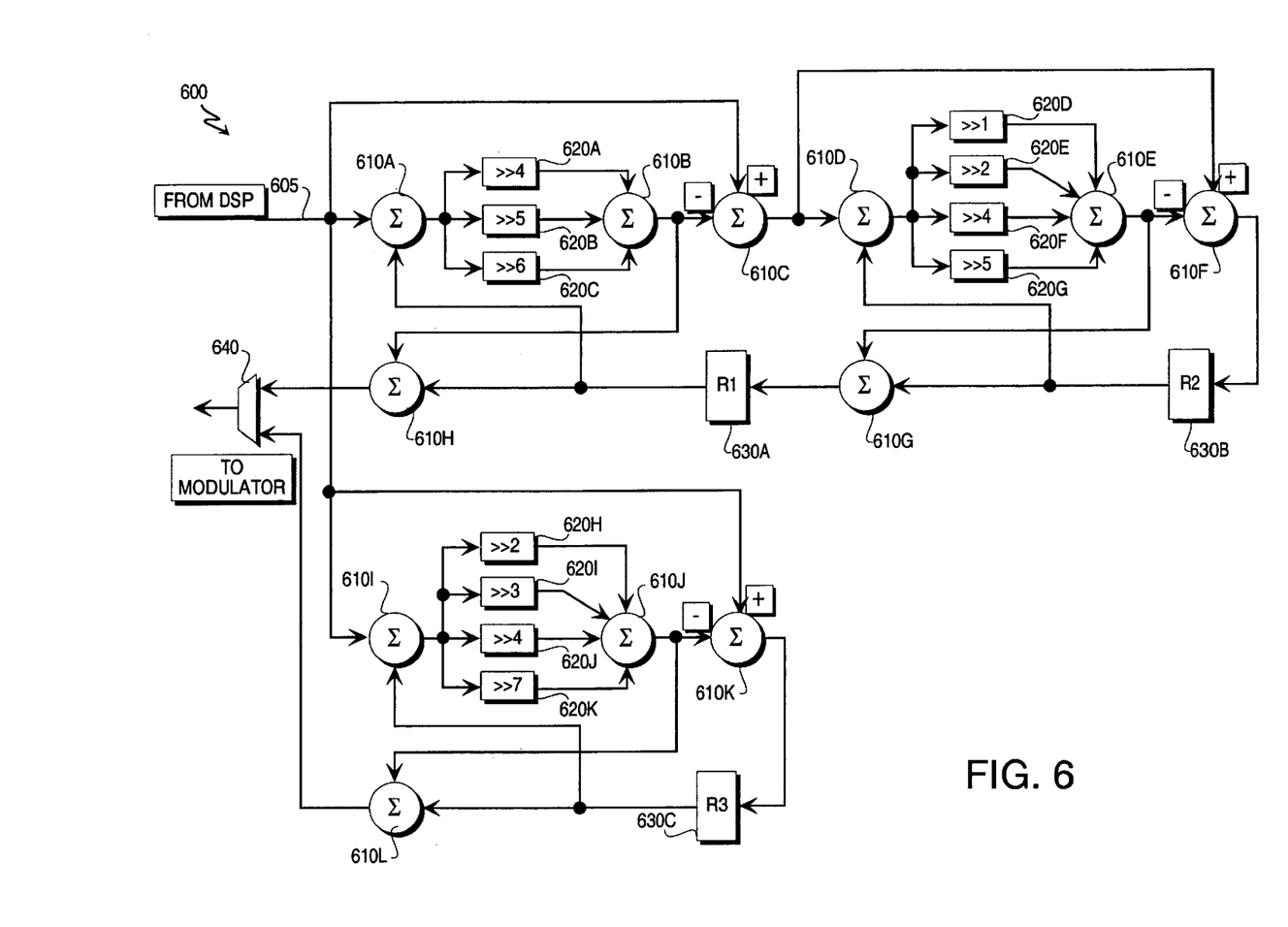
FIG. 6 is a block diagram illustrating the structure of a multiplierless interpolator according to one embodiment of the present invention.

FIG. 6 is a block diagram illustrating the structure of a multiplierless interpolator according to one embodiment of the present invention. As shown in FIG. 6, a digital input sample signal 605 arrives from a Digital Signal Processor ("DSP") or other signal source, and is combined with the output of a first register 630A at adder 610A. The output of adder 610A is routed in parallel to shifter 620A (which shifts the input right by 4 bits), shifter 620B (which shifts the input right by 5 bits), and to shifter 620C (which shifts the input right by 6 bits). The outputs of shifters 620A, 620B, and 620C are added together at adder 610B, and the resulting output is subtracted from the value of the input sample signal 605 at adder 610C.

Still referring to FIG. 6, the output of adder 610C is combined with the output of a second register 630B at adder 610D. The output of adder 610D is routed in parallel to shifter 620D (which shifts the input right by 1 bit), shifter 620E (which shifts the input right by 2 bits), shifter 620F (which shifts the input right by 4 bits), and to shifter 620G (which shifts the input right by 5 bits). The outputs of shifters 620D, 620E, 620F, and 620G are added together at adder 610E, and the resulting output is subtracted from the value of the output of adder 610C at adder 610F. The output of adder 610F is routed to a second register 630B, and the output of second register 630B is added to the output of adder 610F at adder 610G. The output of adder 610G is routed to first register 630A, and the output of first register 630A is added to the output of adder 610B at adder 610H. The output if adder 610H forms one input to multiplexer 640.

Still referring to FIG. 6, the digital input sample signal 605 is also combined with the output of a third register 630C at adder 610I. The output of adder 610I is routed in parallel to shifter 620H (which shifts the input right by 2 bits), shifter 620I (which shifts the input right by 3 bits), shifter 620J (which shifts the input right by 4 bits), and to shifter 620K (which shifts the input right by 7 bits). The outputs of shifters 620H, 620I, 620J, and 620K are added together at adder 610J, and the resulting output is subtracted from the value of the input sample signal 605 at adder 610K. The output of adder 610K is routed to a third register 630C, and the output of third register 630C is added to the output of adder 610J at adder 610L. The output of adder 610L forms a second input to multiplexer 640. The output of multiplexer 640 is the output of interpolator stage 600.

Figure 7:
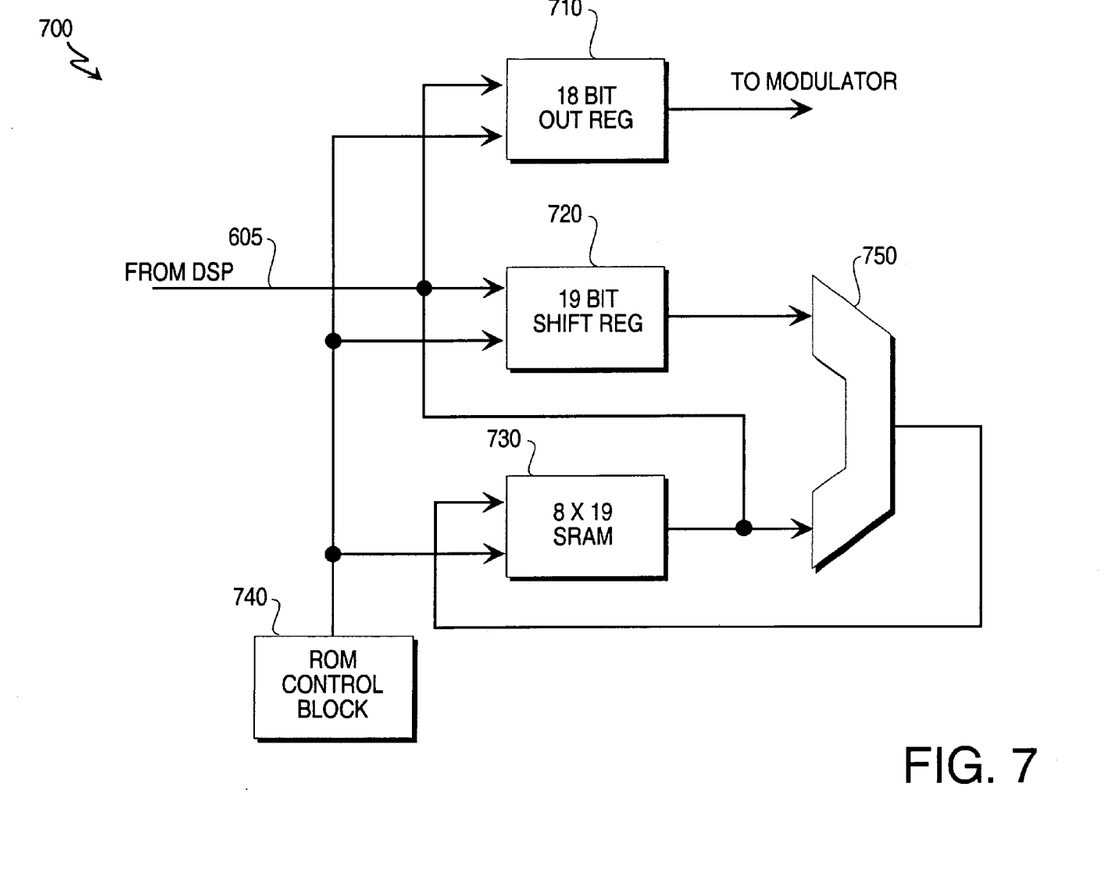
FIG. 7 is a block diagram illustrating a hardware implementation of an interpolator structure according to one embodiment of the present invention.

FIG. 7 is a block diagram illustrating one hardware implementation of the interpolator structure shown in FIG. 6 according to one embodiment of the present invention. As shown in FIG. 7, this embodiment 700 comprises an 18-bit output register 710, a 19-bit shift register 720, an 8×19 bit static random access memory ("SRAM") register file 730, a read only memory ("ROM") control block 740, and a simple arithmetic logic unit ("ALU") 750.

Still referring to FIG. 7, a digital input sample signal 605 is routed to 18-bit output register 710 and 19-bit shift register in parallel. ROM control block 740 functions a sequencer, or state machine, and controls the 19-bit output register 710, 19-bit shift register 720 and 8×19 bit SRAM register file 730 to implement the functionality required by the interpolator algorithm of FIG. 6. The output of SRAM register file 730 is also routed to 18-bit output register 710 and 19-bit shift register 720. The outputs of 19-bit shift register 720 and 8×19 bit SRAM register file 730 form the inputs of ALU 750. The output of 18-bit output register 710 is the output of interpolator circuit 700.

Still referring to FIG. 7, the 8×19 bit SRAM register file 730 is capable of being loaded from either the output of the DSP section or the output of the adder. The SRAM register file 730 can supply data to the adder, the shift register or the output register. Thus, using the appropriate sequence, described below, the interpolator of FIG. 6 can be implemented in less than one sample period, i.e. within 64 clocks at a 1.28 MHz rate.

Using the structure shown in FIG. 7, the interpolator shown in FIG. 6 might be sequenced as described herein. In one embodiment, the output is registered and changes at a 40 kHz rate. The modulator will read that output value 32 consecutive times, thus completing the interpolation. Table 1, below, provides a listing of the registers and purpose used in the structure shown in FIG. 7, including the eight registers in 8×19 bit SRAM register file 730, the output register 710, and the 19-bit shift register 720.

TABLE 1

Interpolator Register Usage

| Register | Description |
| --- | --- |
| R0 | Dummy location, read all 0s |
| R1 | Delay element for first stage all pass lattice section of $A_0(z)$ |
| R2 | Delay element for second stage all pass lattice section of $A_0(z)$ |
| R3 | Delay element for first stage all pass lattice section of $A_1(z)$ |
| R4 | Input from DSP into first stage all pass lattice section of $A_0(z)$ & $A_1(z)$ |
| R5 | Input into second stage all pass lattice section of $A_0(z)$ |
| R6 | Output holding register |
| R7 | Accumulator (A) |
| SR | Shift Register |
| OR | Output Register |

The format of the pseudo-operations used to control the hardware resources shown in FIG. 7 is as follows:

OP SRC, DST

For the pseudo-operation "shift," the source and destination are implied to be the shift register. For the pseudo-operations "add" and "sub," there is an implied second source, which is the shift register. For example, the "add" and "sub" operations mean the following:

ADD SRC, DST //DST=SRC+SR

SUB SRC, DST //DST=SRC−SR

The complete pseudo-instruction sequence given in Table 2 is intended as an exemplary reference of the sequence used in one embodiment, and is written using commented pseudo-instructions so as to make them easily understood by those skilled in the art. It is to be understood that each particular implementation may differ depending on its particular requirements. Moreover, the actual instructions may be rearranged as necessary according to each particular implementation.

TABLE 2

Interpolator Pseudo-instruction sequence

| Cycle | Operation | Comment |
|---|---|---|
| 0 | add R7, R7 | A+=X>>7; multiply done |
| 1 | ld R7, SR | SR = X*$K_{1,0}$ |
| 2 | add R3, R6 | new output sample |
| 3 | sub R4, R3 | update delay element |
| 4 | nop | no operation is performed |
| 5 | ld R0, all | only if CBRST is 1, otherwise NOP |
| 6 | nop | no operation is performed |
| 7 | ld R6, OR | output odd sample |
| 8 | nop | no operation is performed |
| 9 | ld DSP, SR | ld DSP, SR (changes path) |
| 10 | shift | ShfR1, or ShfL1 (conditionally) |
| 11 | shift | ShfR1, or ShfL1 (conditionally) |
| 12 | shift | ShfR1, or ShfL1 (conditionally) |
| 13 | shift | ShfR1, or ShfL1 (conditionally) |
| 14 | shift | ShfR1, or ShfL1 (conditionally) |
| 15 | shift | ShfR1, or ShfL1 (conditionally) |
| 16 | shift | ShfR1, or ShfL1 (conditionally) |
| 17 | shift | ShfR1, or ShfL1 (Trim) |
| 18 | shift or jam | ShfR1 (Trim) or JAM |
| 19 | ld SR, R4 | ld SR, R4 (changes path) |
| 20 | nop | no operation is performed |
| 21 | add R1, R7 | A = DSP + R1 |
| 22 | ld R7, SR | input to multiplier |
| 23 | shift R | X >> 1 |
| 24 | shift R | X >> 2 |
| 25 | shift R | X >> 3 |
| 26 | shift R | X >> 4 |
| 27 | add R0, R7 | A = X>>4 |
| 28 | shift R | X >> 5 |
| 29 | add R7, R7 | A+= X >> 5 |
| 30 | shift R | X >> 6 |
| 31 | add R7, R7 | A+= X >> 6; multiply done |
| 32 | ld R7, SR | SR = X*$K_{1,0}$ |
| 33 | add R1, R6 | new output sample |
| 34 | sub R4, R5 | second stage input |
| 35 | ld R2, SR | copy delay element to SR |
| 36 | add R5, R7 | A = 2nd stage input + R2 |
| 37 | ld R7, SR | input to multiplier |
| 38 | shift R | X >> 1 |

TABLE 2-continued

Interpolator Pseudo-instruction sequence

| Cycle | Operation | Comment |
|---|---|---|
| 39 | ld R6, OR | output even sample |
| 40 | add R0, R7 | A = X >> 1 |
| 41 | shift R | X >> 2 |
| 42 | add R7, R7 | A+= X >> 2 |
| 43 | shift R | X >> 3 |
| 44 | shift R | X >> 4 |
| 45 | add R7, R7 | A+= X >> 4 |
| 46 | shift R | X >> 5 |
| 47 | add R7, R7 | A+= X >> 5; multiply done |
| 48 | ld R7, SR | SR = X*$K_{0,0}$ |
| 49 | add R2, R1 | update 1st delay element |
| 50 | sub R5, R2 | update 2nd delay element |
| 51 | ld R3, SR | copy delay element to SR |
| 52 | add R4, R7 | A = DSP + R3 |
| 53 | ld R7, SR | input to multiplier |
| 54 | shift R | X >> 1 |
| 55 | shift R | X >> 2 |
| 56 | add R0, R7 | A = X >> 2 |
| 57 | shift R | X >> 3 |
| 58 | add R7, R7 | A += X >> 3 |
| 59 | shift R | X >> 4 |
| 60 | add R7, R7 | A+= X >> 4 |
| 61 | shift R | X >> 5 |
| 62 | shift R | X >> 6 |
| 63 | shift R | X >> 7 |

Another important consideration is the quantization of the input to the interpolator. In one embodiment, the DSP section providing digital input samples to the interpolator according to the invention uses a floating-point format consisting of a 5-bit 2's complement exponent, and a 9-bit normalized mantissa, which is also in 2's complement format. The leading bit of the mantissa is the sign bit. The binary point follows the sign bit, so that the rest of the mantissa bits are fraction bits. There is an implied "1" before the binary point, although it is not explicitly present. This format is illustrated in Table 3.

TABLE 3

Floating Point Format

| e4 | e3 | e2 | e1 | e0 | s | f7 | f6 | f5 | f4 | f3 | f2 | f1 | f0 |
|---|---|---|---|---|---|---|---|---|---|---|---|---|---|

According to this format, the value of the floating point number is given as follows:

$s\overline{s}.fffffff \times 2^{eeeee}$

For example, the number 00_0000_0000_0000 represents an exponent of 0 and a mantissa of +1.00000000. Therefore, the number is $+1.00000000 \times 2^0 = 1.0$. As another example, the number 11_1111_0000_0000 is $-2.0 \times 2^{-1} = -1.0$. As a special case, the most negative exponent, 10000, and an all 0 mantissa represents the value of 0, that is 10_0000_0000=0.0.

In one embodiment, the input to the interpolator must be a 19-bit fixed point number. However, the 19$^{th}$ bit is reserved as a guard bit to prevent overflow on intermediate calculations in the interpolator. Thus, the maximum value must be limited to 18 bits. The floating-point format described above provides 9 bits of precision over 40 bits of dynamic range. Therefore, as those skilled in the art will recognize, the values must be limited to 18 bits of dynamic range. A sequence of steps to perform this limiting function is given below:

First, the floating point exponent is added to the 2 trim bits. The trim bits form an unsigned number ranging from 0 to 3. The trim required ranges from 1 to 4, so a 1 must be added to the result. A trim value of 3 provides the least amount of headroom at high amplitude and the most precision at low amplitude. A trim value of 0 provides the most amount of headroom at high amplitude and the least precision at low end.

$$exp_{adjusted} = exp_{(floating\ format)} + trim + 1$$

Second, the leading bit of the result is the exponent sign bit, which indicates the direction of the shift. The number of bits to shift is the value of the 4 LSBs if the sign bit is 0, or the ones complement of the 4 LSBs if the sign bit is negative. It should be noted that by taking the one's complement instead of the two's complement, an offset is created which must be subsequently corrected.

$$direction = exp_{adjusted} \quad (4)$$

$$shift = (direction == 0)\ ?\ exp_{adjusted}(3:0) : \sim exp_{adjusted}(3:0)$$

Third, the maximum left shift without overflow is 8. A right shift of 9 will cause an underflow. In case of overflow, the resulting number must be limited to either the most positive or most negative number depending on the sign of the mantissa. In case of underflow, additional shifts results in the same value, so the number of right shifts is limited to avoid extra work. It should be noted that the ones complement of (−9) is (+8). Therefore, it is only required to check for a shift count greater that 8 in either direction and to limit the shift count to 8.

$$shift = (shift > 8)\ ?\ 8 : shift$$

$$overflow = (shift > 8\ \&\&\ direction == 0)$$

$$limit = (sign == 0)\ ?\ 001\_1111\_1111\_0000\_0000 : 110\_0000\_0000\_1111\_1111$$

Figure 8:
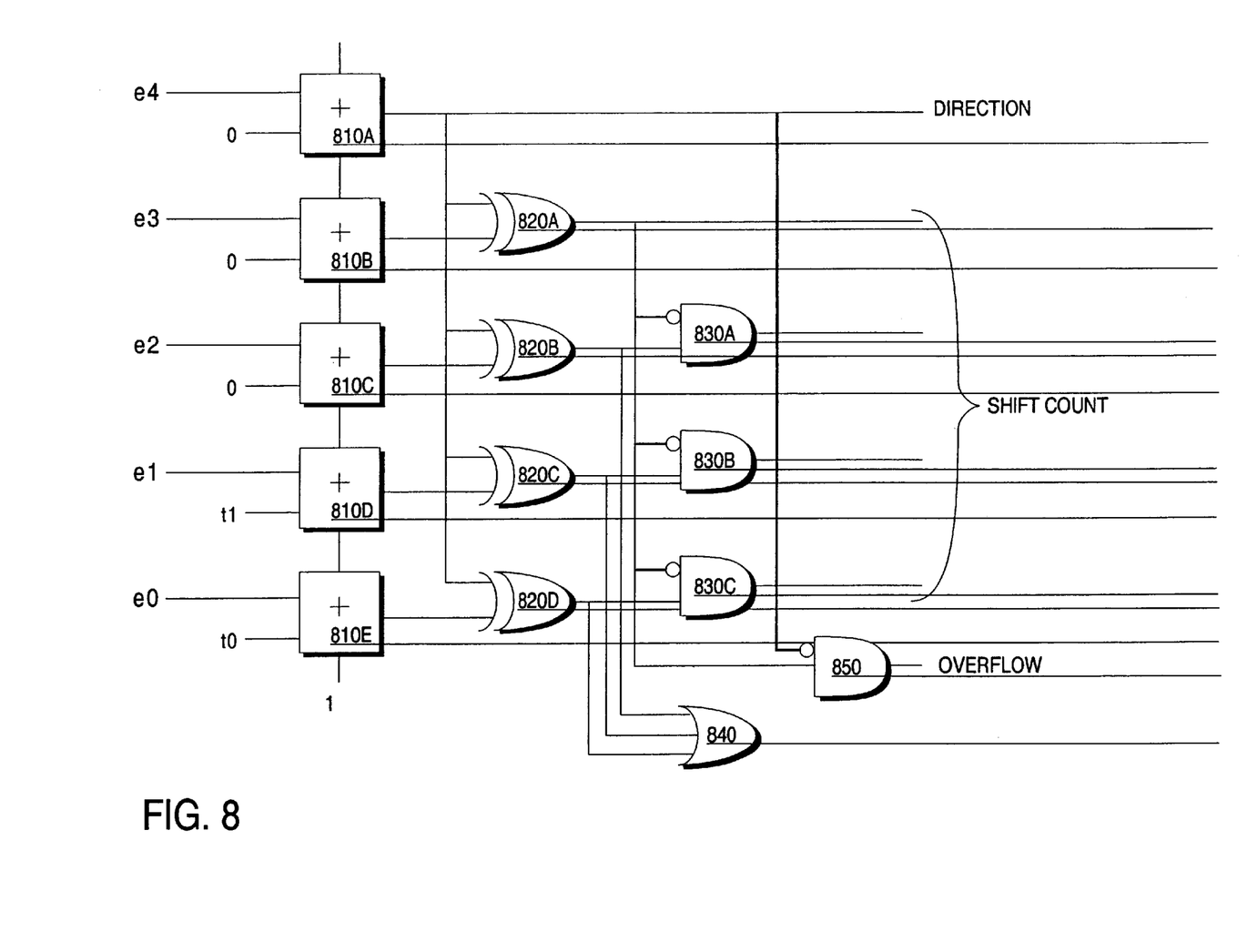
FIG. 8 is a block diagram illustrating shifting circuitry that may be used as part of an interpolator structure according to one embodiment of the present invention.

FIG. 8 illustrates how the above three steps may be implemented according to one aspects of the present invention. Referring now to FIG. 8, shifting circuitry 800 comprises 5 adders 810A–810E, four exclusive OR gates 820A–820D, three AND gates 830A–830C for shift count, one three-input OR gate 840, and one three-input AND gate 850 for overflow. As shown in FIG. 8, the adjusted exponent is obtained by adding the floating point exponent to the trim bits. The direction, shift count, and overflow bits described above are generated by combining the outputs of adders 810A–810E with exclusive OR gates 820A–820D and AND gates 830A–830C as shown in FIG. 8.

Specifically, the most significant bit of the shift count is formed by combining the outputs of adders 810A and 810B in exclusive OR gate 820A. The next bit of the shift count is formed by combining the outputs of adders 810A and 810C in exclusive OR gate 820B, then combining the output of exclusive OR gate 820B with the inverted output of exclusive OR gate 820A in AND gate 830A. The next bit of the shift count is formed by combining the outputs of adders 810A and 810D in exclusive OR gate 820C, then combining the output of exclusive OR gate 820C with the inverted output of exclusive OR gate 820A in AND gate 830B. The final bit of the shift count is formed by combining the outputs of adders 810A and 810E in exclusive OR gate 820D, then combining the output of exclusive OR gate 820D with the inverted output of exclusive OR gate 820A in AND gate 830C. The overflow bit is formed by combining the outputs of exclusive OR gates 820B–820D in three-input OR gate 840, then combining the output of three-input OR gate 840 with the output of exclusive OR gate 820A and the inverted output of adder 810A in three-input AND gate 850.

Thus, as described above, the mantissa must be shifted right or left according to the direction and shift count. In one embodiment, the mantissa is first completely right-justified in the 19-bit register. Then, the mantissa is shifted. This is described with reference to the equations below, Table 4, and the following discussion.

$$sreg = \{\{10\{man\ (8)\}\}, \sim man\ (8), man\ (7:0)\}$$

$$sreg = (direction == 0)\ ?\ sreg << shift : sreg >> shift;$$

TABLE 4

Floating Point to Fixed Point Initial Alignment

| 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|
| s | s | s | s | s | s | s | s | s | s | ~s | f7 | f6 | f5 | f4 | f3 | f2 | f1 | f0 |

First, by taking the ones complement, the right shift count is one less than it should be. That is corrected by shifting right once more if a right shift is being performed.

$$sreg = (direction == 0)\ ?\ sreg : sreg >> 1$$

If performed sequentially in hardware, this and the previous step would take nine cycles to complete. This next table shows the shift count and cycle count. A "1" in a column indicates that a shift occurs in that cycle. Since the mantissa is always shifted in subsequent cycles if it is shifted in any cycle, the logic to decode the shift can be a simple "and/or tree " of the shift counts bits and the previous shift enable bit. This is shown in Table 6.

TABLE 5

Example of Mantissa Shift Cycles

| | cycle number | | | | | | | | |
|---|---|---|---|---|---|---|---|---|---|
| shift count | 0 | 1 | 2 | 3 | 4 | 5 | 6 | 7 | 8* |
| 0000 | | | | | | | | | 1 |
| 0001 | | | | | | | | 1 | 1 |
| 0010 | | | | | | | 1 | 1 | 1 |
| 0011 | | | | | | 1 | 1 | 1 | 1 |
| 0100 | | | | | 1 | 1 | 1 | 1 | 1 |
| 0101 | | | | 1 | 1 | 1 | 1 | 1 | 1 |
| 0110 | | | 1 | 1 | 1 | 1 | 1 | 1 | 1 |
| 0111 | | 1 | 1 | 1 | 1 | 1 | 1 | 1 | 1 |
| 1000 | 1 | 1 | 1 | 1 | 1 | 1 | 1 | 1 | 1 |

*A shift occurs only if the direction = 1 (i.e., a right shift)

TABLE 6

Example Shift Cycle Decoding

| shift cycle | equation |
|---|---|
| s0 | c3 |
| s1 | (c2 & c1 & c0) \| s0 |
| s2 | (c2 & c1) \| s1 |
| s3 | (c2 & c0) \| s2 |
| s4 | c2 \| s3 |
| s5 | (c1 & c0) \| s4 |
| s6 | c1 \| s5 |
| s7 | c0 \| s6 |
| s8 | direction |

Second, if the shift count indicates an overflow, the shifted mantissa must be replaced with the positive or negative limit:

sreg=(overflow=1) ? limit:sreg

This step could occur at almost any time, but because of hardware considerations in one embodiment, it is convenient to perform it at this time. Also, this step and the previous step can be combined into a more complex conditional assignment.

Figure 9:
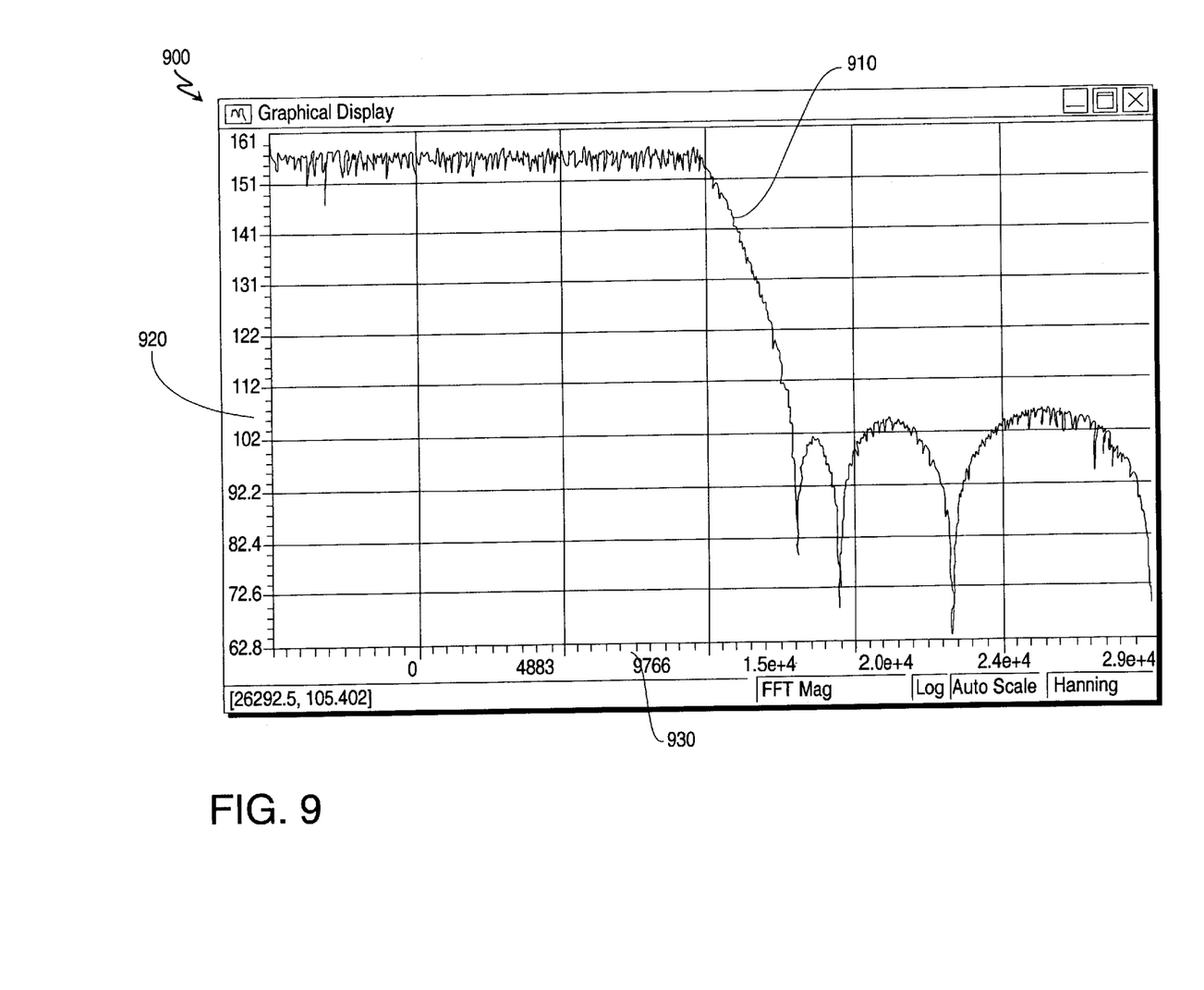
FIG. 9 is a graph illustrating the frequency response to a swept sine wave of an interpolator according to one embodiment of the present invention.

FIG. 9 is a graph illustrating the frequency response of an interpolator according to one embodiment to a swept sine wave. The input amplitude of the tone, which is 131071 units at its peak, along with the size of the Fast Fourier Transform ("FFT"), scales the plot up to approximately 156 dB. Experiments and simulation revealed that, upon examination of the maximum absolute value of the outputs of the adders, only one guard bit is necessary to prevent overflow. A maximum digital input of $2^{17}=131071$ units requires that the adders be 19 bits wide: 17 significant bits+1 sign bit+1 guard bit. The largest value was the sum of the input and the first lattice delay element (R1 [630A] in FIG. 6) which had a value of approximately 236,000 units.

Thus, the interpolator algorithm and structure according to aspects of the present invention achieves the design requirements in a computationally efficient and circuit area efficient manner. As part of a larger and more complex signal processing system, it facilitates providing better sound quality to end customers.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A multiplierless digital signal interpolator, comprising:
    a first stage receiving a digital input signal at a predetermined sample rate, wherein said first stage comprises a half-band Infinite Impulse Response ("IIR") filter having coefficients suitable for multiplierless implementation followed by an expander which increases said sample rate by a factor of two; and
    a second stage comprising a zero-order-hold ("ZOH") circuit.

2. The multiplierless digital signal interpolator of claim 1, wherein said half-band IIR filter is implemented using an all-pass lattice structure.

3. The multiplierless digital signal interpolator of claim 1, wherein said ZOH circuit holds the output value of said first stage for 32 clock cycles.

4. The multiplierless digital signal interpolator of claim 2, wherein said ZOH circuit holds the output value of said first stage for 32 clock cycles.

5. The multiplierless digital signal interpolator of claim 1, wherein said multiplierless digital signal interpolator is implemented in hardware comprising:
    a control sequencer;
    a register file receiving control information from said control sequencer and data from the output of an arithmetic logic unit;
    a shift register receiving control information from said control sequencer and data from a digital sample signal source and from said register file; and
    an output register receiving control information from said control sequencer and data from a digital sample signal source and from said register file.

6. The multiplierless digital signal interpolator of claim 5, wherein said control sequencer comprises a read-only memory ("ROM").

7. The multiplierless digital signal interpolator of claim 5, wherein said control sequencer comprises a read-only memory ("ROM") structure and wherein said register file comprises a random access memory ("RAM") structure.

8. A multiplierless digital signal interpolator for use in a delta-sigma audio digital-to-analog converter ("DAC"), comprising:
    a first stage receiving a digitized input audio signal at a predetermined sample rate, wherein said first stage comprises a half-band Infinite Impulse Response ("IIR") filter having coefficients suitable for multiplierless implementation followed by an expander which increases said sample rate by a factor of two; and
    a second stage comprising a zero-order-hold ("ZOH") circuit.

9. The multiplierless digital signal interpolator of claim 8, wherein said half-band IIR filter is implemented using an all-pass lattice structure.

10. The multiplierless digital signal interpolator of claim 8, wherein said ZOH circuit holds the output value of said first stage for 32 clock cycles.

11. The multiplierless digital signal interpolator of claim 9, wherein said ZOH circuit holds the output value of said first stage for 32 clock cycles.

* * * * *

UNITED STATES PATENT AND TRADEMARK OFFICE
CERTIFICATE OF CORRECTION

PATENT NO. : 6,313,773 B1
DATED : November 6, 2001
INVENTOR(S) : Wilson et al.

It is certified that error appears in the above-identified patent and that said Letters Patent is hereby corrected as shown below:

Column 4,
Line 49, replace "$k_{0.0}$" with -- $k_{0,0}$ --.
Line 51, replace "$k_{0.1}$" with -- $k_{0,1}$ --.
Line 53, replace "$k_{1.0}$" with -- $k_{1,0}$ --.

Column 8,
Line 31, between "the" and "invention" insert -- present --.

Column 10,
Line 46, replace "counts" with -- count --.

Signed and Sealed this

Second Day of April, 2002

Attest:

Attesting Officer

JAMES E. ROGAN
Director of the United States Patent and Trademark Office